United States Patent
Chen

(10) Patent No.: US 7,296,801 B2
(45) Date of Patent: Nov. 20, 2007

(54) ANTI-LEAKAGE DEVICE FOR LUBRICATION OIL IN A FAN

(76) Inventor: Mao-Lin Chen, No. 248-27, Hsin Chien Road, Chien Zhen District, Kaohsiung (TW) 806

( * ) Notice: Subject to any disclaimer, the term of this patent is extended or adjusted under 35 U.S.C. 154(b) by 381 days.

(21) Appl. No.: 10/784,281

(22) Filed: Feb. 24, 2004

(65) Prior Publication Data

US 2005/0184467 A1    Aug. 25, 2005

(51) Int. Cl.
*F16C 33/74* (2006.01)
*F16J 15/40* (2006.01)

(52) U.S. Cl. ............. 277/429; 384/119; 384/130; 384/132

(58) Field of Classification Search .......... 277/428, 277/429; 384/119, 130, 132
See application file for complete search history.

(56) References Cited

U.S. PATENT DOCUMENTS

| | | | | | |
|---|---|---|---|---|---|
| 1,879,626 | A | * | 9/1932 | Mendenhall et al. | 277/428 |
| 2,020,512 | A | * | 11/1935 | Mendenhall et al. | 277/428 |
| 4,093,323 | A | * | 6/1978 | Quandt et al. | 384/220 |
| 6,024,496 | A | * | 2/2000 | Shy | 384/279 |
| 6,554,478 | B2 | * | 4/2003 | Hsieh | 384/130 |
| 6,692,152 | B2 | * | 2/2004 | Shingai et al. | 384/100 |

* cited by examiner

*Primary Examiner*—Alison K. Pickard

(57) ABSTRACT

An anti leakage device of lubrication oil for a fan includes a hub seat, a sleeve and a hub. The sleeve is provided on the hub seat and has a bearing therein to form an oil storage part for receiving lubrication oil. The hub is provided on the hub seat and has an annular recess at the inside thereof for being inserted with the sleeve. Hence, leakage from the oil storage part can be avoided by way of provision of the annular recess.

1 Claim, 2 Drawing Sheets

ANTI-LEAKAGE DEVICE FOR LUBRICATION OIL IN A FAN

BACKGROUND OF THE INVENTION

1. Field of the Invention

The present is related to an anti leakage device for lubrication oil in a fan and particularly to a device preventing the lubrication oil in a bearing of a fan from leaking.

2. Brief Description of Related Art

Due to running speed of the computer getting faster and resulting in more heat being generated, cooling device has become one of essential parts arranged in the computer for dissipating the heat effectively. The cooling fan is convenient while in use and cheap in cost so that it has become the most popular cooling device. A good cooling fan depends on good quality of the motor completely and an unstably running motor seriously affects the normal operation of the whole cooling fan. Further, the bearing is a key influencing quality and stability of the motor.

The ball bearing has been adopted in the conventional fan motor at the time of the fan motor being used at the very beginning. But, the metal balls, which are usually 8 to 12 pieces disposed and turning in the bearing ring connecting with the rotational shaft, are not complete round due to fabricating problems. Nevertheless, the balls and the bearing ring may be a little deformed under preload and a phenomenon of runout may generate during running in case of the roundness of the metal balls or the bearing ring is not so flawless. The phenomenon of runout is not synchronous with rotation of the motor and this type of motor is called nonrepeatable runout (NRRO).

Another restriction to ball bearing type motor is in that it is not possible for the motor to offer a desirable speed increase. When the ball bearing type motor provides a certain high speed, temperature rise resulting from the high speed will affect quality of lubrication oil and it is unable to meet the anticipated life span and reliability for a long period of time.

In the mean time, the metal balls of the ball bearing may be forced to enter the bearing ring and it results in the metal balls generating some little recesses, which provide greater possibility to occur NRRO. Accordingly, it also has greater possibility to generate noise.

Currently, self-lubrication bearing is popularly used for meeting the market of consumer electronic equipment. Due to providing a feature of high self-lubrication, the bearing is not necessary to have the aid of foreign grease for lubrication. Further, the self-lubrication bearing is provided with high load itself so that excellent performance can be obtained even under low rotational speed. In addition, providing very low surface friction coefficient, the self-lubrication bearing can offer excellent wear resistant performance under a condition of rotary movement. Moreover, it is very safe for the self-lubrication bearing being used in an environment of high or low temperature. Besides, other advantages such as low cost and occupying less space can be obtained from the self-lubrication bearing.

Furthermore, Taiwanese Patent Publication No. 86215592, entitled OIL STORAGE BEARING ASSEMBLY, discloses that the bearing assembly is mounted to a groove of a motor seat and the bearing structure includes a rotational shaft with a recess part, a sleeve being placed in the groove without engaging bolt for catching the recess part of the shaft so as to effect one side mount, and a bearing placed in the sleeve and disposed at the engaging bolt. Thus, an oil storage zone can be formed between the bearing, the sleeve and the engaging bolt for receiving a certain amount of lubrication oil and replenishing oil required by the rotational shaft during turning.

The preceding prior art further provides an alternate structure at the center of the fan blade and the alternate structure includes a first annular uneven surface and a second annular uneven surface. The first uneven surface surround the rotational shaft and the second annular uneven surface surrounds the first uneven surface next to an end of the sleeve. It is possible to prevent the oil contained in the bearing from leaking outward and provides a function of catching leaked oil by way of multiple round about paths.

However, there are problems for the above-mentioned prior art while in use. The first annular uneven surface extends outward next to outer side of the sleeve to constitute an open space and the lubrication oil can leak via the open space. As a result, unfavorable lubrication due to oil decreasing will cause high heat and damage and oily dirt may stain the multiple round about paths to affect the rotational efficiency and life span of the heat generating parts under operation of abnormal temperature.

SUMMARY OF THE INVENTION

An object of the present invention is to provide an anti leakage device for lubrication oil in a fan in which a hub thereof has a groove for being inserted with a sleeve to prevent lubrication oil in the sleeve from leaking out so as to prolong the life span of the fan.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENT

Figure 1:
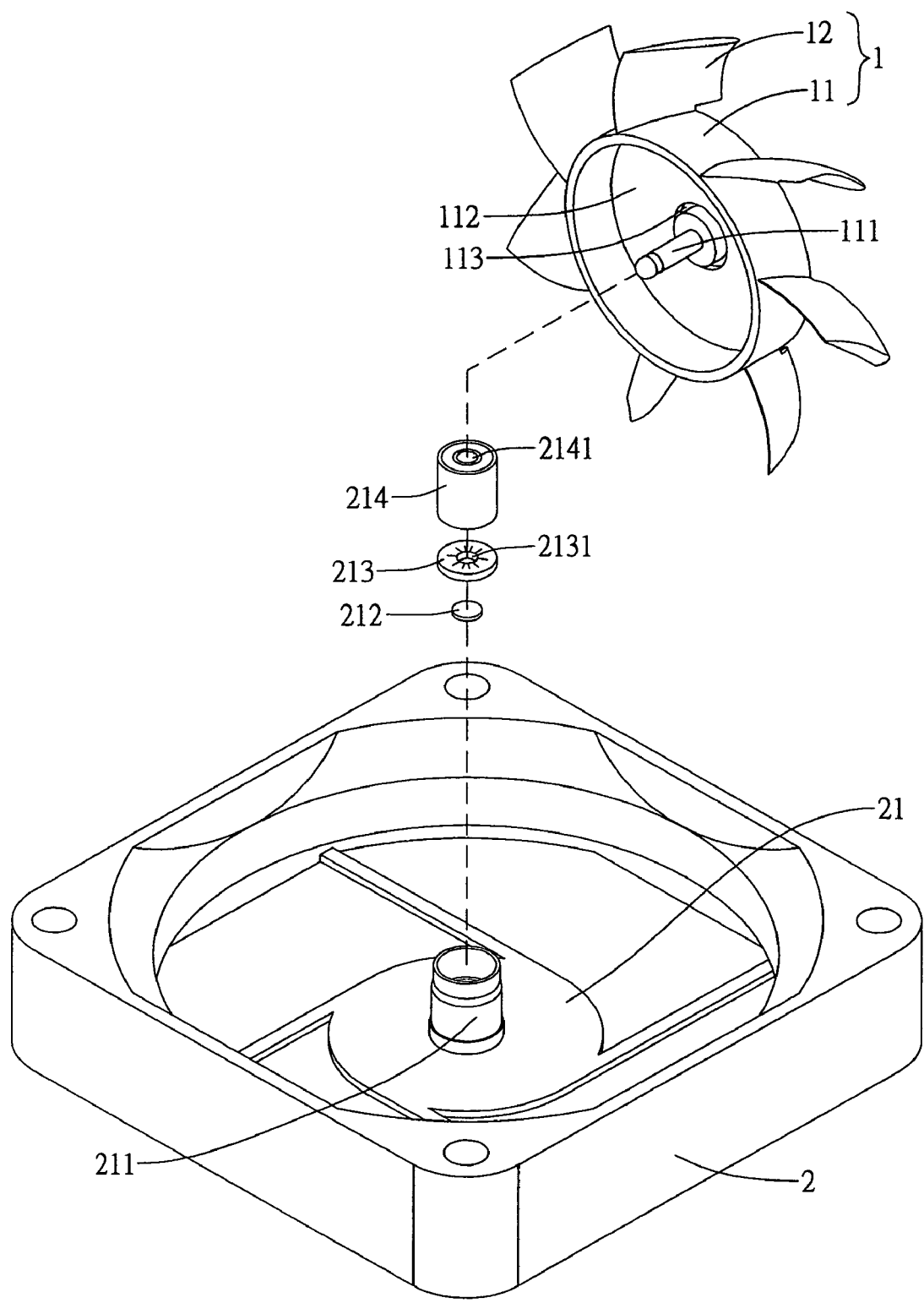
FIG. 1 is an exploded perspective view of the anti leaking device for lubrication oil in a fan according to the present invention.
Figure 2:
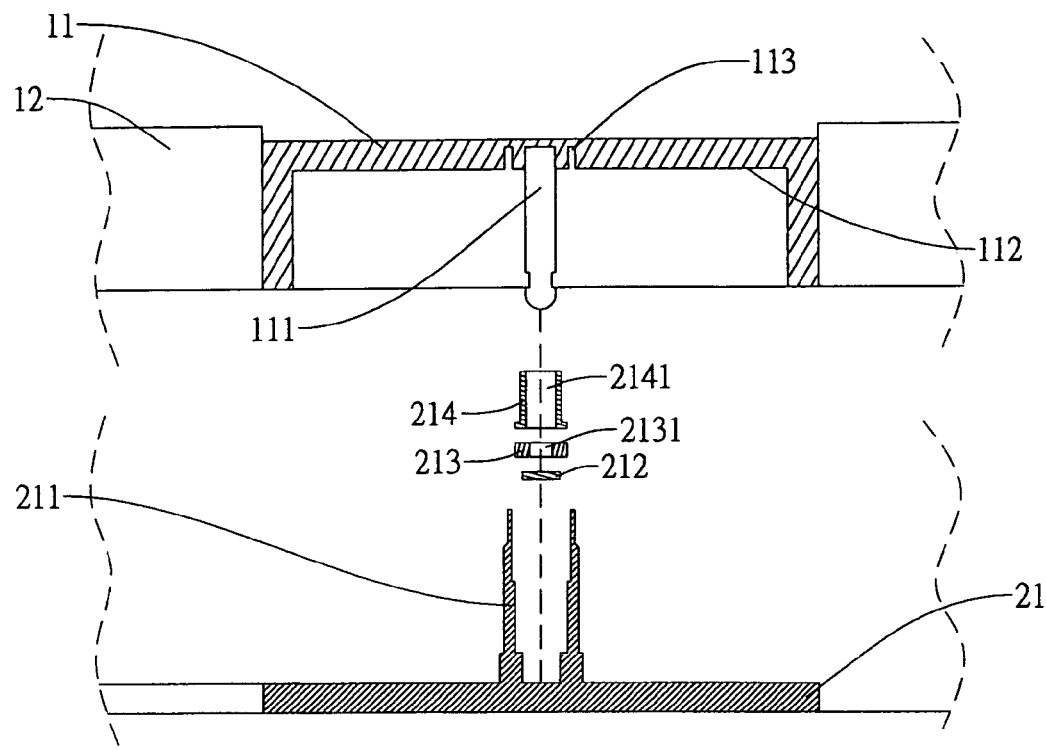
FIG. 2 is an exploded sectional view of the leaking device according to the present invention.

Referring to FIGS. 1 and 2, an anti-leak device for lubrication oil in a fan according to the present invention includes a fan blade wheel 1 and a fan frame 2. The fan blade wheel 1 is composed of a hub 11 and a plurality of blades 12 extending outward from the hub 11 radially. The hub 11 has at the center thereof a rotational shaft 111 and at inner side thereof an annual recess 113 around the shaft 111. The fan frame 2 provides a hub seat 21 with a sleeve 211 and a durable pad 212, an engaging piece 213 and a bearing 214 are received in the sleeve 211. The engaging piece 213 and the bearing 214 are provided with an air aperture 2131, 2141 respectively.

Figure 3:
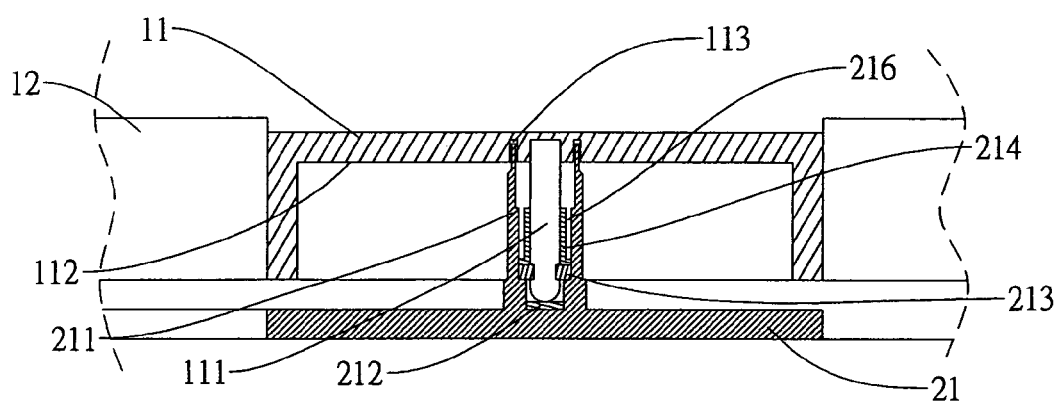
FIG. 3 is an assembled sectional view of FIG. 2.

Referring to FIG. 3 in company with FIG. 2, during being assembled, the durable pad 212 is placed at the bottom of the sleeve 211 first, then the engaging piece 213 and the bearing 214 are placed on the durable pad 212 to allow the bearing 214 becoming an oil storage part 216 for receiving lubrication oil. Next, the rotational shaft 111 of the fan blade wheel 1 is inserted into the sleeve 211 to pierce the through holes 2141, 2131 of the bearing 214 and engaging piece 213 sequentially so as to have the shaft 111 being held by the engaging piece 213. Further, the hub 11 can be pivotally attached to the hub seat 21 and the sleeve 211 at the head end thereof is inserted into the annular recess 113 at the inner side of the hub 11. In the meantime, the shaft 111 at an end thereof contacts with the durable pad 212 at bottom of the sleeve 211 so that the durable pad 212 can reduce the friction resistance resulting from the rotational shaft 111.

Once the rotational shaft 111 rotates, the annular recess 113 at the inner side 112 of the hub 11 can catch the lubrication oil flowing outward from the rotational shaft 111 so that the caught lubrication oil can flow back to the oil storage part 216 to avoid the lubrication oil leakage. In this way, it not only keeps sufficient lubrication oil storage to prolong life span of the bearing 214 but also prevents accumulated oily dirt resulting from oil leakage to enhance rotational efficiency.

While the invention has been described with referencing to a preferred embodiment thereof, it is to be understood that modifications or variations may be easily made without departing from the spirit of this invention, which is defined by the appended claims.

What is claimed is:

1. An anti-leakage device of lubrication oil for a fan, comprising:
   a hub seat;
   a sleeve, being fixedly attached to the center of the hub seat and providing a heat end;
   a durable pad, being circular and disposed inside the sleeve;
   an engaging piece, being circular and disposed inside the sleeve above the durable pad;
   a bearing, being disposed inside the sleeve to sit on the engaging piece;
   a shaft, providing a first end being inserted into the sleeve fitting with the bearing and having a neck part next to the end engaging with the engaging piece; and
   a hub, being joined to a second end of the shaft and having a central annular recess surrounding the shaft to fitting with the head end of the sleeve;
   characterized in that the sleeve, which has a lower section with an inner diameter being less than rest part thereof, fits with the durable pad, which is placed at the bottom of the sleeve, a middle section with an inner diameter being greater than the lower section to form a shoulder between the lower section and the middle section for being sit with the engaging piece sitting on the shoulder and fitting with the middle section and allowing the bearing being disposed next to the shoulder to form an oil storage part between the outer circumference of the bearing and the inner wall of the middle part for the shaft passing through the bearing and the engaging piece with first end of the shaft being received in the lower section and touching the durable pad.

* * * * *